US009659652B2

(12) United States Patent
Takeyama et al.

(10) Patent No.: US 9,659,652 B2
(45) Date of Patent: May 23, 2017

(54) SEMICONDUCTOR STORAGE DEVICE AND CONTROL METHOD THEREOF

(71) Applicant: Kabushiki Kaisha Toshiba, Minato-ku (JP)

(72) Inventors: Yoshikazu Takeyama, Fujisawa (JP); Masaru Koyanagi, Tokyo (JP); Akio Sugahara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/215,672

(22) Filed: Jul. 21, 2016

(65) Prior Publication Data

US 2016/0329099 A1 Nov. 10, 2016

Related U.S. Application Data

(63) Continuation of application No. 14/023,009, filed on Sep. 10, 2013.

(30) Foreign Application Priority Data

Nov. 20, 2012 (JP) ................................. 2012-254702

(51) Int. Cl.
*G11C 7/00* (2006.01)
*G11C 14/00* (2006.01)
(Continued)

(52) U.S. Cl.
CPC ........ *G11C 14/0018* (2013.01); *G11C 7/1084* (2013.01); *G11C 8/12* (2013.01);
(Continued)

(58) Field of Classification Search
CPC ... G11C 7/1084; G11C 29/028; G11C 29/022; G11C 8/12; G11C 2029/0407; G11C 16/00; G11C 2029/0409
See application file for complete search history.

(56) References Cited

U.S. PATENT DOCUMENTS 5,727,005 A 3/1998 Le et al.
7,290,109 B2 * 10/2007 Horii ................... G06F 13/1647
711/103
(Continued)

FOREIGN PATENT DOCUMENTS

JP 2003-7963 1/2003
JP 2003-223784 8/2003
(Continued)

OTHER PUBLICATIONS

Office Action issued Aug. 30, 2016 in Japanese Patent Application No. 2012-254702 (with English translation).

(Continued)

*Primary Examiner* — Pho M Luu
*Assistant Examiner* — Mohammed A Bashar
(74) *Attorney, Agent, or Firm* — Oblon, McClelland, Maier & Neustadt, L.L.P.

(57) ABSTRACT

According to one embodiment, a semiconductor storage device includes a plurality of semiconductor chips and a control unit. The plurality of semiconductor chips is configured to connect to a signal transmission path and is controlled individually by individual chip enable signals. The plurality of semiconductor chips each includes a termination circuit connected to the signal transmission path. When one of the semiconductor chips is selected to input or output data, the control unit activates the termination circuit provided in the semiconductor chip that is not selected based on a first instruction signal and the chip enable signal.

19 Claims, 6 Drawing Sheets

(51) Int. Cl.
  *G11C 7/10* (2006.01)
  *G11C 8/12* (2006.01)
  *G11C 29/02* (2006.01)
  *G11C 16/04* (2006.01)
  *G11C 16/08* (2006.01)
  *G11C 16/10* (2006.01)
  *G11C 16/26* (2006.01)
  *G11C 16/00* (2006.01)
  *G11C 29/04* (2006.01)

(52) U.S. Cl.
  CPC .......... *G11C 16/0483* (2013.01); *G11C 16/08* (2013.01); *G11C 16/10* (2013.01); *G11C 16/26* (2013.01); *G11C 29/022* (2013.01); *G11C 29/028* (2013.01); *G11C 16/00* (2013.01); *G11C 2029/0407* (2013.01); *G11C 2029/0409* (2013.01)

(56) References Cited

U.S. PATENT DOCUMENTS

| | | |
|---|---|---|
| 2007/0080707 A1 | 4/2007 | Brinkman et al. |
| 2008/0001623 A1 | 1/2008 | Kim |
| 2008/0054936 A1 | 3/2008 | Fujisawa |
| 2008/0074930 A1 | 3/2008 | Kanda |
| 2008/0192548 A1* | 8/2008 | Shibata ............... G11C 11/5628 365/185.17 |
| 2009/0256587 A1 | 10/2009 | Kuboyama et al. |
| 2009/0287877 A1* | 11/2009 | Chu .................... G06F 13/1668 711/103 |
| 2010/0231275 A1 | 9/2010 | Kitagawa |

FOREIGN PATENT DOCUMENTS

| | | |
|---|---|---|
| JP | 2007-95067 | 4/2007 |
| JP | 2008-17475 | 1/2008 |
| JP | 2008-60641 | 3/2008 |
| JP | 2008077779 | 4/2008 |
| JP | 2008-521158 | 6/2008 |
| JP | 2009-118479 | 5/2009 |
| JP | 2009-252322 | 10/2009 |
| JP | 2010-219751 | 9/2010 |
| JP | 2011-135436 | 7/2011 |

OTHER PUBLICATIONS

Office Action mailed Jan. 12, 2016 in Japanese Application No. 2012-254702 filed Nov. 20, 2012 (w/English translation).
Hynix Semiconductor, et al. "Open NAND Flash Interface Specification" Mar. 9, 2011.

* cited by examiner

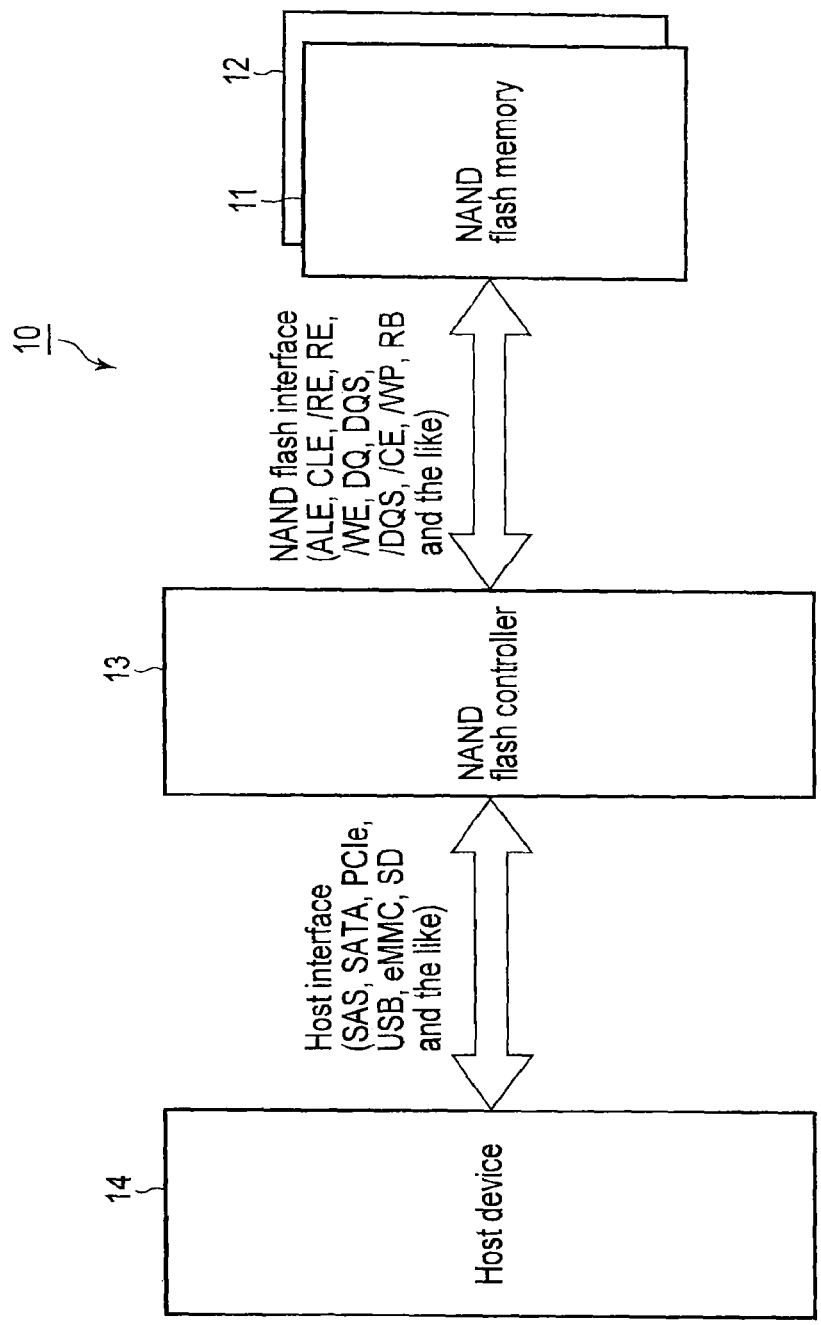
F I G. 1

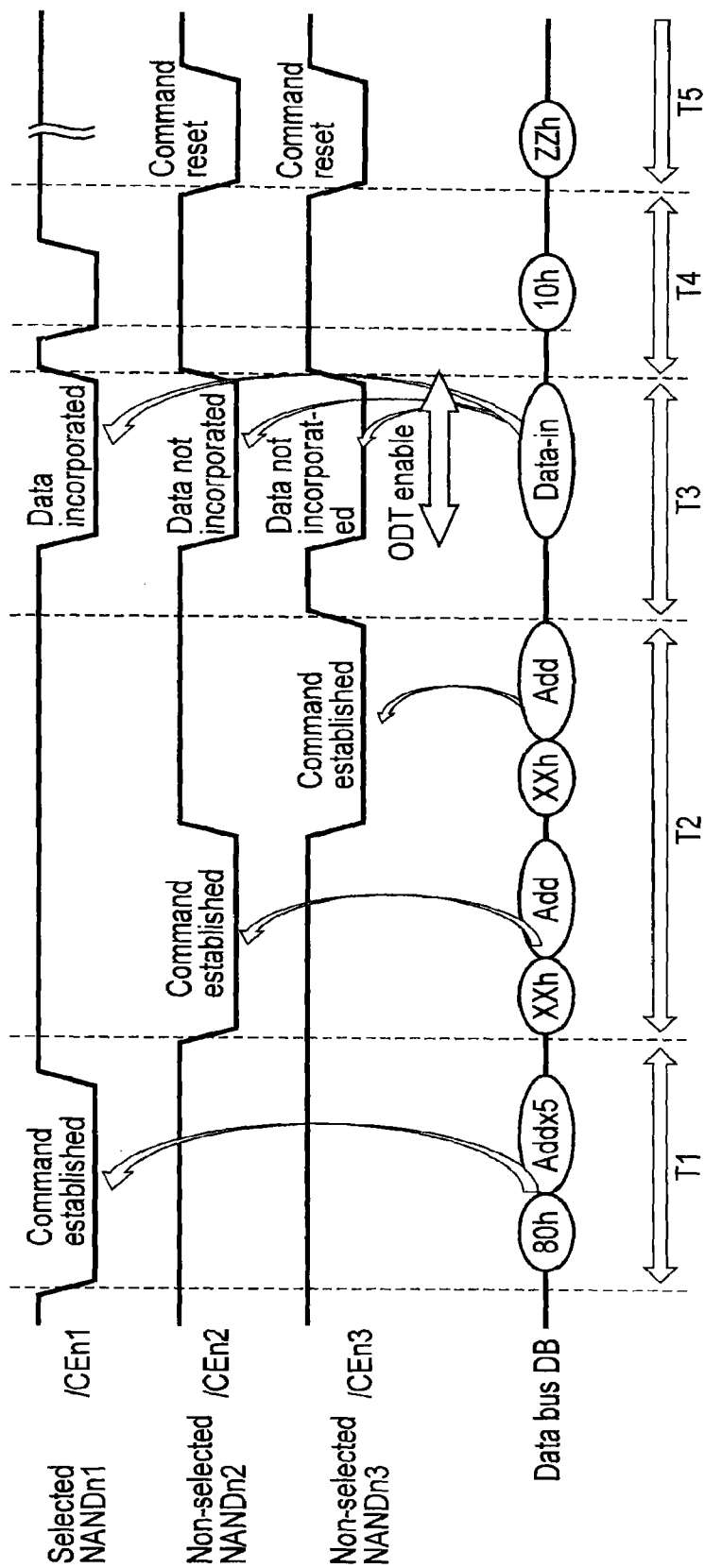
F I G. 4

| [7] | [6] | [5] | [4] | [3] | [2] | [1] | [0] | | Resistance [Ω] |
|---|---|---|---|---|---|---|---|---|---|
| 0 | 0 | 0 | 0 | 0 | 0 | 0 | 0 | def | ODT not set |
| 0 | 0 | 0 | 1 | 0 | 0 | 0 | 1 | | R1 |
| 0 | 0 | 1 | 0 | 0 | 0 | 1 | 0 | | R2 |
| 0 | 0 | 1 | 1 | 0 | 0 | 1 | 1 | | R3 |
| 0 | 1 | 0 | 0 | 0 | 1 | 0 | 0 | | R4 |
| 0 | 1 | 0 | 1 | 0 | 1 | 0 | 1 | | R5 |
| 0 | 1 | 1 | 0 | 0 | 1 | 1 | 0 | | R6 |
| 0 | 1 | 1 | 1 | 0 | 1 | 1 | 1 | | R7 |
| 1 | 0 | 0 | 0 | 1 | 0 | 0 | 0 | | R8 |
| 1 | 0 | 0 | 1 | 1 | 0 | 0 | 1 | | R9 |
| 1 | 0 | 1 | 0 | 1 | 0 | 1 | 0 | | R10 |
| 1 | 0 | 1 | 1 | 1 | 0 | 1 | 1 | | R11 |
| 1 | 1 | 0 | 0 | 1 | 1 | 0 | 0 | | R12 |
| 1 | 1 | 0 | 1 | 1 | 1 | 0 | 1 | | R13 |
| 1 | 1 | 1 | 0 | 1 | 1 | 1 | 0 | | R14 |
| 1 | 1 | 1 | 1 | 1 | 1 | 1 | 1 | | R15 |
F I G. 6
F I G. 7 A
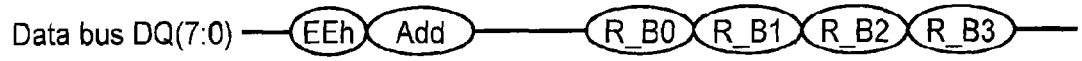
F I G. 7 B

SEMICONDUCTOR STORAGE DEVICE AND CONTROL METHOD THEREOF

CROSS-REFERENCE TO RELATED APPLICATIONS

This application is continuation of and claims the benefit of priority under 35 U.S.C. §120 from U.S. Ser. No. 14/023,009 filed Sep. 10, 2013, and claims the benefit of priority under 35 U.S.C. §119 from Japanese Patent Application No. 2012-254702 filed Nov. 20, 2012, the entire contents of each of which are incorporated herein by reference.

FIELD

Embodiments described herein relate generally to a semiconductor storage device and a control method thereof.

BACKGROUND

To increase the storage capacity, a semiconductor storage device in which a plurality of semiconductor chips is provided in a package and these semiconductor chips are connected by a data bus has been developed. It is known that when data is output from one of the plurality of semiconductor chips connected to the same data bus or data is input to one chip, signal characteristics are degraded due to reflection of signals on the data bus.

To reduce degradation of signal characteristics, for example, a technology called on-die termination (ODT) has been developed for a dynamic RAM (DRAM). ODT is a technology that provides a terminating resistor in each semiconductor chip and enables the chip selected for input/output of data and the other terminating resistors of non-selected chips.

BRIEF DESCRIPTION OF THE DRAWINGS

FIG. 1 is a block diagram schematically showing a semiconductor storage device according to an embodiment;
FIG. 4 is a timing chart showing a write operation in the present embodiment;
FIG. 6 is a diagram illustrating values of resistance of terminating resistors;
and
FIG. 7A is a timing chart showing an operation to set the resistance of the terminating resistor,
and FIG. 7B is a timing chart showing the operation to check set parameters.

DETAILED DESCRIPTION

Figure 2:
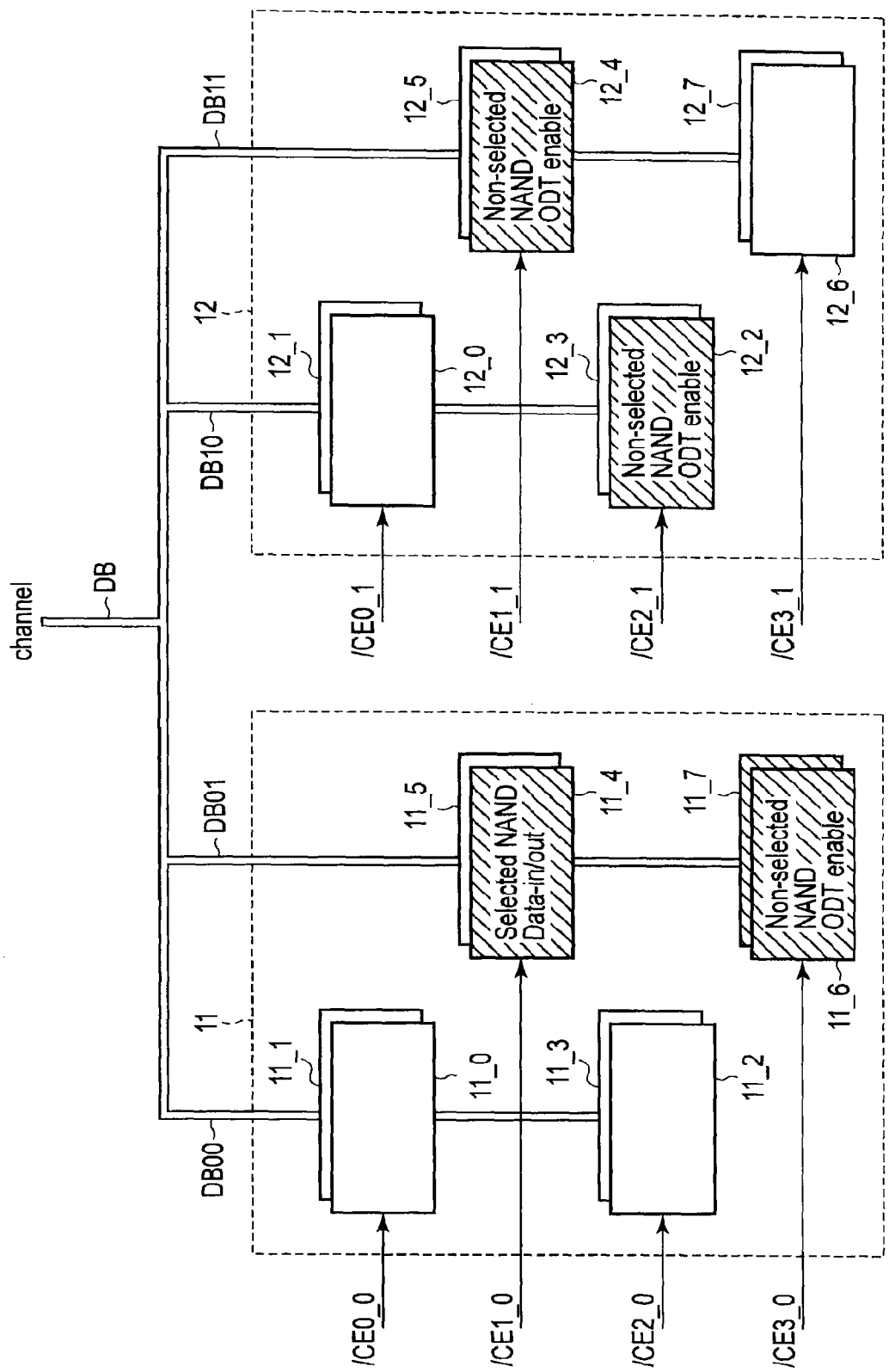
FIG. 2 is a block diagram showing a part of FIG. 1.

In general, according to one embodiment, a semiconductor storage device includes a plurality of semiconductor chips and a control unit. The plurality of semiconductor chips is configured to connect to a signal transmission path and is controlled individually by individual chip enable signals. The plurality of semiconductor chips each includes a termination circuit connected to the signal transmission path. When one of the semiconductor chips is selected to input or output data, the control unit activates the termination circuit provided in the semiconductor chip that is not selected based on a first instruction signal and the chip enable signal.

As described above, ODT attempts to improve the signal characteristics of a DRAM. A semiconductor chip needs a special signal to control ODT and a package needs a special pin to input the signal. However, existing NAND flash memories do not have a special pin to control ODT and it is not advisable to add such a pin to a package, as with a DRAM, because the addition of the pin requires a larger package, signals on a printed circuit board become more complicated due to an increased signal, and costs are increased. Thus, in the present embodiment, ODT is realized without adding a pin.

An embodiment will be described below with reference to the drawings.

FIG. 1 shows an outline configuration of a nonvolatile semiconductor storage device, for example, a NAND flash memory system to which the present embodiment is applied.

In FIG. 1, a NAND flash memory system 10 includes, for example, NAND flash memories 11 and 12 and a NAND flash controller 13 (hereinafter, also called simply a controller). NAND flash memories 11 and 12 are not limited to two memories and may be one memory or three or more memories. As will be described later, each of NAND flash memories 11 and 12 contains a plurality of NAND chips. In addition, the configuration is not limited such that one NAND flash memory contains a plurality of NAND chips and a plurality of NAND flash memories, each mounted with one NAND chip, may be provided.

NAND flash memories 11 and 12 are connected to the controller 13. As an interface between the controller 13 and NAND flash memories 11 and 12, an address latch enable signal ALE, a command latch enable signal CLE, read enable signals /RE (/indicates a low active signal), RE, a write enable signal /WE, a data signal DQ, data strobe signals DQS and /DQS, a chip enable signal /CE, a write protect signal /WP, and a ready/busy signal RB are used. NAND flash memories 11 and 12 are controlled by the controller 13 using these signals.

The controller 13 is connected to a host device 14. A host interface is changed according to the mode of application of NAND flash memories 11 and 12. When NAND flash memories 11 and 12 constitute a solid-state drive (SSD), an interface conforming to the Serial Attached SCSI (SAS), Serial ATA (SATA), or Programmable Communications Interface (PCIe) standard is used; when they constitute a Universal Serial Bus (USB) flash drive or the like, an interface conforming to the Universal Serial Bus standard is used; when they constitute a MultiMediaCard (MMC), an interface conforming to the Embedded MultiMediaCard (eMMC) standard is used; and when they constitute a Secure Digital (SD) card, an interface conforming to the Secure Digital memory standard is used.

The controller 13 receives a request signal output from the host device 14 via the host interface and generates the chip enable signal /CE and the command latch enable signal CLE, address latch enable signal ALE, write enable signal /WE, read enable signal /RE, or write protect signal /WP in accordance with the request signal.

When writing data to NAND flash memories 11 and 12 in accordance with a request signal received from the host device 14, the controller 13 supplies the data to NAND flash memories 11 and 12 via a data bus DB (also called a channel) as a signal transmission path.

When reading data from NAND flash memories 11 and 12 in accordance with a request signal received from the host device 14 as a response to the host device 14, the controller 13 receives data read from NAND flash memories 11 and 12 via the data bus DB.

FIG. 2 schematically shows the configuration inside NAND flash memories 11 and 12 illustrated in FIG. 1 and shows the relationship between a plurality of NAND chips and chip enable signals.

In FIG. 2, each of NAND flash memories 11 and 12 is configured by, for example, eight NAND chips. NAND flash memory 11 contains NAND chips 11_0 to 11_7. Chip enable signals /CE0_0 to /CE3_0 are supplied to pairs of NAND chips (11_0 and 11_1), (11_2 and 11_3) to (11_6 and 11_7), respectively. One of the pair of NAND chips is selected in each of the pairs of NAND chips 11_0 and 11_1 to 11_6 and 11_7 based on chip enable signals /CE0_0 to /CE3_0 and the chip address.

NAND flash memory 12 contains NAND chips 12_0, 12_1 to 12_7. Chip enable signals /CE0_1 to /CE3_1 are supplied to pairs of NAND chips (12_0 and 12_1), (12_2 and 12_3) to (12_6 and 12_7), respectively. One of the pair of NAND chips is selected in each of the pairs of NAND chips 12_0 and 12_1 to 12_6 and 12_7 based on chip enable signals /CE0_1 to /CE3_1 and the chip address.

NAND chips 11_0, 11_1, 11_2 and 11_3 are connected to a data bus DB00 as a signal transmission path and NAND chips 11_4, 11_5, 11_6 and 11_7 are connected to a data bus DB01. NAND chips 12_0, 12_1, 12_2 and 12_3 are connected to a data bus DB10 and NAND chips 12_4, 12_5, 12_6 and 12_7 are connected to a data bus DB11. These data buses DB00 to DB11 are connected to, for example, the common data bus DB. Packages or channels do not necessarily need to be connected by the common data bus and only a configuration in which a plurality of NAND chips is connected to one channel is needed.

Each of NAND chips 11_0 to 12_7 contains an ODT circuit described later and when some NAND chip is selected, the ODT circuits of non-selected NAND chips are enabled.

FIG. 2 shows a case when NAND chip 11_4 is selected and data is input or output. In this case, for example, the ODT circuits of non-selected NAND chips 11_6 and 11_7 connected to the same data bus DB01 as NAND chip 11_4 are enabled and further, the ODT circuits of NAND chip 12_2 connected to data bus DB10 and NAND chip 12_4 connected to data bus DB11 are enabled. Which non-selected NAND chips to select with respect to the selected NAND chip to enable the ODT circuits thereof is determined based on, for example, a test to decide a combination of the selected NAND chip and non-selected NAND chips that produces good signal characteristics.

Figure 3:
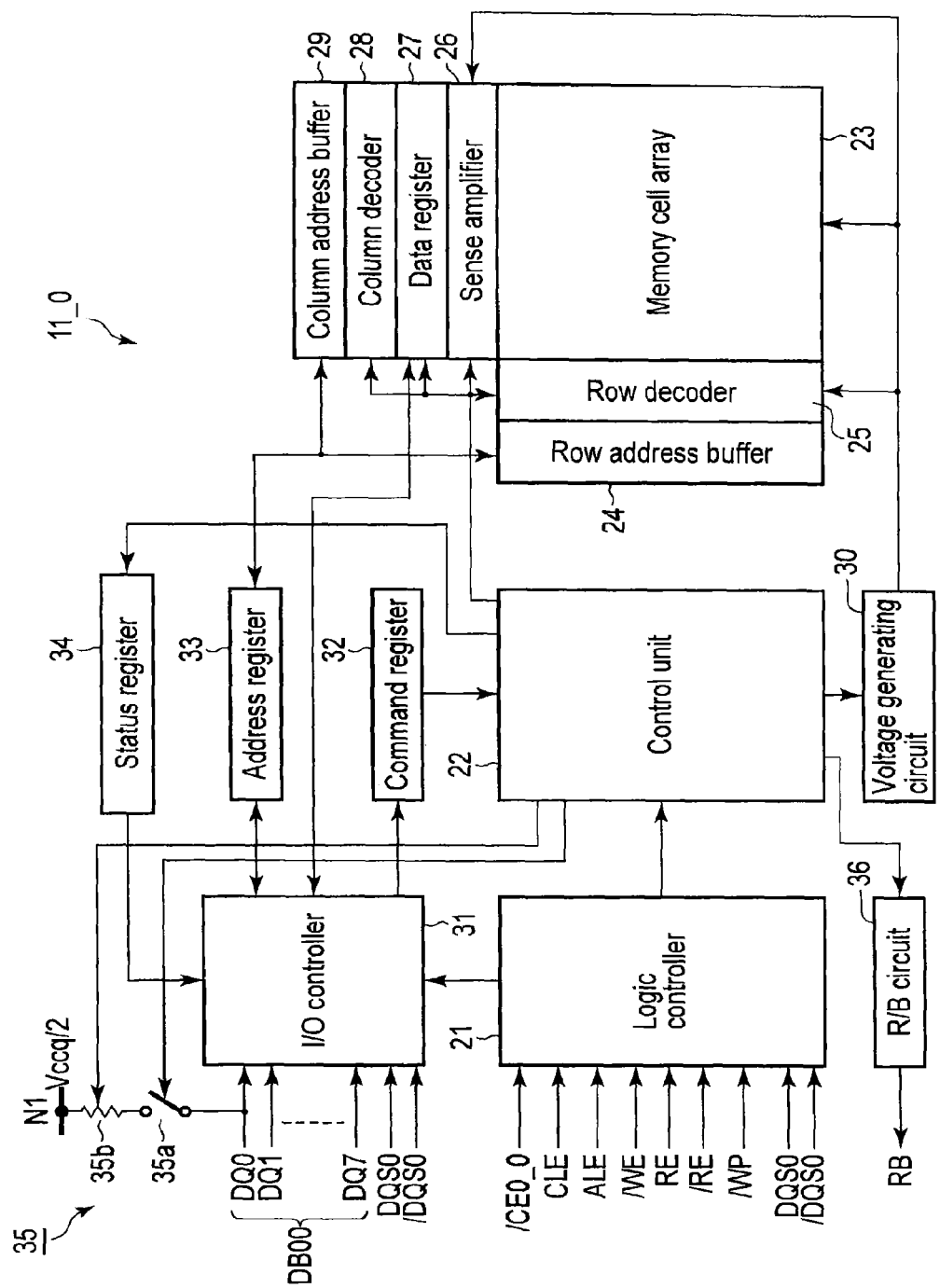
FIG. 3 is a block diagram showing a part of FIG. 2.

FIG. 3 schematically shows the configuration of NAND chip 11_0. NAND chips 11_0 to 12_7 have the same configuration and thus, only NAND chip 11_0 will be described.

NAND chip 11_0 includes a logic controller 21, a control unit 22, a memory cell array 23, a row address buffer 24, a row decoder 25, a sense amplifier 26, a data register 27, a column decoder 28, a column address buffer 29, a voltage generating circuit 30, an input/output (I/O) controller 31, a command register 32, an address register 33, a status register 34, an ODT circuit 35, and a ready/busy (R/B) circuit 36.

Chip enable signal /CE0_0, command latch enable signal CLE, address latch enable signal ALE, write enable signal /WE, read enable signal RE and /RE, write protect signal /WP, and clock signals DQS0 and /DQS0 output from the controller 13 are supplied to the logic controller 21. Commands, addresses, and data output from the controller 13 are supplied to the I/O controller 31 via signal lines DQ0 to DQ7 constituting data bus DB00. Further, the clock signals DQS0 and /DQS0 are supplied also to the I/O controller 31.

The logic controller 21 controls the control unit 22 and the I/O controller 31 according to an input signal. The command register 32 holds a command output from the I/O controller 31. The address register 33 holds an address output from the I/O controller 31.

The control unit 22 controls the row decoder 25, the sense amplifier 26, the data register 27, the column decoder 28, the voltage generating circuit 30, and the R/B circuit 36 according to a command held in the command register 32 to control data writing, reading, or erasure.

The R/B circuit 36 outputs the ready/busy signal RB in accordance with an output signal of the control unit 22.

The voltage generating circuit 30 generates a write voltage, a read voltage, or an erase voltage according to instructions of the control unit 22 and supplies these voltages to the memory cell array 23, the row decoder 25, and the sense amplifier 26.

The memory cell array 23 includes a plurality of NAND strings (not illustrated). Each NAND string is configured by first and second selection transistors and a plurality of memory cells being connected in series. The first selection transistor is connected to a bit line and the second selection transistor is connected to a source line. Gate electrodes of the first and second selection transistors are connected to first and second selection lines respectively and a control gate electrode of each memory cell is connected to a word line. Each of the bit lines is connected to the sense amplifier 26.

The row address buffer 24 and the column address buffer 29 hold a row address and a column address held in the address register 33 respectively. The row decoder 25 decodes the row address held in the row address buffer and selects the first and second selection lines and the word line of the memory cell array 23.

The column decoder 28 decodes the column address held in the column address buffer and selects the bit line of the memory cell array 23.

The data register 27 supplies data supplied from the I/O controller 31 during data writing to the sense amplifier 26. The data register 27 also holds and supplies data detected from the selected bit line by the sense amplifier 26 during data reading to the I/O controller 31.

The sense amplifier 26 writes data held in the data register 27 to the selected memory cell during data writing. The sense amplifier 26 also reads data from the selected memory cell via the bit line during data reading.

The status register 34 holds status data indicating, for example, whether reading, writing, or erasure of data output from the control unit 22 has normally terminated. The status data held in the status register 34 is supplied to the host device 14 via the I/O controller 31, data bus DB00, and the controller 13.

The ODT circuit 35 is connected to signal lines operating at high speed such as each of the signal lines DQ0 to DQ7 constituting data bus DB00, /RE, RE, DQS, /DQS and the like. FIG. 3 shows only the ODT circuit 35 connected to the data line DQ0 for convenience of description.

The ODT circuit 35 includes a switch 35a connected in series between the data line DQ0 and a node N1 and a terminating resistor 35b. The voltage, for example, Vccq/2 is supplied to the node N1.

The switch 35a is configured by, for example, a MOS transistor and the switch 35a is controlled by the control unit 22. The terminating resistor 35b is enabled to change the resistance. More specifically, the terminating resistor 35b may be constituted of, for example, a plurality of transistors connected in series or in parallel and configured to change the number of transistors that are turned on by the control unit 22 to set the resistance based on the on resistance. Alternatively, the terminating resistor 35b may be constituted of a plurality of resistors and a plurality of transistors and configured to change the number of transistors that are turned on by the control unit 22 to set the resistance to change the number of resistors connected in series or in parallel.

Next, the operation of the ODT circuit 35 when data is input or output will be described.

When a plurality of NAND chips is connected to the same data bus and data is input to the selected NAND chip or data is output from the selected NAND chip, signal characteristics can be improved by enabling the ODT circuit 35 provided in non-selected NAND chips.

In the present embodiment, the ODT circuit 35 is controlled by using commands (first and second instruction signals), chip enable signals, and addresses.

The resistance of the terminating resistor 35b constituting the ODT circuit 35 is separately set by the method of parameter settings or the like. The setting of the resistance of the terminating resistor 35b will be described later.

(Setting Operation of ODT During Data Input)

Data input is done during programming of a NAND flash memory. Thus, a write command and a write address are input and then, a non-selected NAND chip is specified to enable the ODT circuit 35. The non-selected NAND chip is selected by a chip enable signal and a chip address. To enable the ODT circuits 35 of a plurality of non-selected NAND chips, the above selection operation is repeated a plurality of times.

FIG. 4 shows a setting operation of ODT when data is written. FIG. 4 shows a case in which ODT circuits of non-selected NAND chips n2 and n3 are enabled when data is input to a selected NAND chip n1.

First, when a command 80h (h indicates a hexadecimal number) indicating a write command and an address Add×5 (×5 stands for that, for example, the address is output five times consecutively) are output from the controller 13 illustrated in FIG. 1, a chip enable signal /CEn1 supplied to selected NAND chip n1 is activated (period T1).

Next, in period T2, when to select non-selected NAND chip n2 is determined, a chip address and a chip enable signal /CEn2 are activated, and then, for example, a command (first instruction signal) "XXh" for enabling the ODT circuits of non-selected NAND chips and an address (chip address) Add are output from the controller 13. These are supplied to the specified non-selected NAND chip n2. Further, when command XXh and the address Add are output from the controller 13, a chip enable signal /CEn3 supplied to non-selected NAND chip n3 specified by the address Add is activated. If there are, among non-selected NAND chips, three chips or more whose ODT circuit 35 should be set to Enable, the above operation is further repeated.

Command XXh is issued before data is transferred to the NAND chip selected by the controller 13 by the write command 80h.

Subsequently, in period T3, when chip enable signals /CEn1, /CEn2 and /CEn3 of selected NAND chip n1 and non-selected NAND chips n2 and n3 are activated, data output from the controller 13 is supplied to, as illustrated in FIG. 3, the UI/O controller 31 of selected NAND chip n1 via the data bus DB and the like and further transferred to the data register 27.

At this point, the ODT circuits 35 of non-selected NAND chips n2 and n3 are enabled by the switch 35a thereof being turned on. Thus, reflection of signals on the data bus is inhibited by the ODT circuit 35 so that signal characteristics are improved.

Subsequently, in period T4, when, for example, a command 10h indicating execution of a program is issued from the controller 13, only chip enable signal /CEn1 of selected NAND chip n1 is activated to write the data held in the data register 27 to the memory cell array 23.

At this point, the ODT circuits 35 of non-selected NAND chips n2 and n3 are held in an enabled state after, for example, the switch 35a being turned on.

Next, in period T5, when, for example, a command (second instruction signal) ZZh to reset the ODT circuit 35 is issued from the controller 13, only chip enable signals /CEn2 and /CEn3 supplied to non-selected NAND chips n2 and n3 are activated and the switches 35a of the ODT circuits 35 are collectively turned off. Accordingly, each of the ODT circuits 35 is reset to reduce wasteful consumption current.

In the above operation, although the ODT circuits 35 of a non-selected chip are collectively turned off, it is not necessary to turn off the ODT circuits 35 of all the non-selected chips. For example, in order to program other chips, when turning on the ODT circuit 35 of another non-selected-chip is required, and in case, there is a chip of which ODT circuit 35 has been turned on, the ODT circuit 35 can be kept ON.

Further more, the write command 80h and an address are input in period T1 and command XXh to set the ODT circuit 35 to Enable and an address are input in period T2. However, the present embodiment is not limited to the above example and command XXh to set the ODT circuit 35 to Enable and an address may be input in period T1 and the write command 80h and an address may be input in period T2. That is, it is only necessary to turn on the ODT circuit 35 before data input.

(Setting Operation of ODT During Data Output)

Next, the setting operation of ODT when data is output from a NAND flash memory will be described.

Data output is done during read operation. Thus, for example, a read operation is performed and data to be output is transferred from a memory cell to the data buffer. Subsequently, the ODT circuit 35 of a non-selected NAND chip not to be read from is enabled to reduce the influence of reflected signals during data output. The non-selected NAND chip is selected, like during data input, by a chip enable signal and a chip address. To enable the ODT circuits 35 of a plurality of non-selected NAND chips, the above selection operation is repeated a plurality of times. Incidentally, the ODT circuit 35 may first be enabled before a read operation of data being performed.

Figure 5:
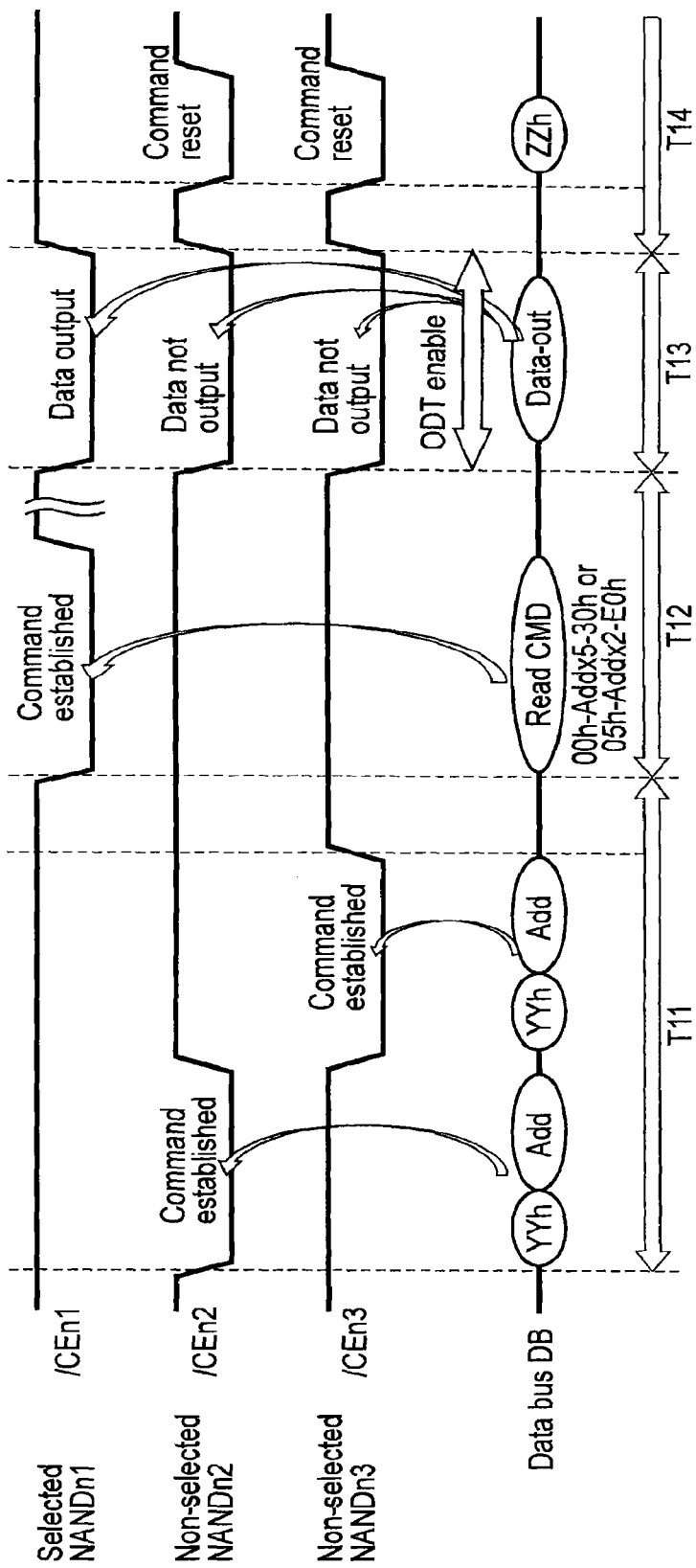
FIG. 5 is a timing chart showing a read operation in the present embodiment.

FIG. 5 shows the setting operation of ODT when data is read. FIG. 5 shows a case in which the ODT circuits 35 of non-selected NAND chips n2 and n3 are enabled when data is output from selected NAND chip n1.

In this case, when, for example, a command YYh to enable the ODT circuit 35 of non-selected NAND chip n2 and the address Add are output from the controller 13, chip enable signal /CEn2 supplied to non-selected NAND chip n2 specified by the address Add is activated. Further, when command YYh and the address Add are output from the controller 13, chip enable signal /CEn3 supplied to non-selected NAND chip n3 specified by the address Add is activated. If there are, among non-selected NAND chips, three chips or more whose ODT circuit 35 should be set to Enable, the above operation is repeated.

In this manner, the ODT circuits 35 of non-selected NAND chips n2 and n3 are set to Enable.

Subsequently, in period T12, if a read command 00h-Add×5-30h is issued or a read operation from a cell has been performed immediately before by the read command, chip enable signal /CEn1 of selected NAND chip n1 is enabled by the controller 13 when a command 05h-Add×2-E0h is issued so that data can be output according to the specified address from selected NAND chip n1. The data is held in the data register 27.

Next, in period T13, chip enable signals /CEn1, /CEn2 and /CEn3 supplied to selected NAND chip n1 and non-selected NAND chips n2 and n3 are activated and the data held in the data register 27 is supplied to the controller 13 via the I/O controller 31 and the corresponding data bus. At this point, the ODT circuits 35 of non-selected NAND chips n2 and n3 are enabled and thus, signal reflection on the data bus is inhibited so that signal characteristics are improved.

When, after the transfer of the data is completed, in period T14, for example, a command ZZh to reset the ODT circuit 35 is issued from the controller 13, only chip enable signals /CEn2 and /CEn3 supplied to non-selected NAND chips n2 and n3 are activated and the switches 35a of the ODT circuits 35 are collectively turned off. Accordingly, each of the ODT circuits 35 is reset to reduce wasteful consumption current. In this case, also it is not necessary to turn off the ODT circuit 35 of a non-selected NAND chip collectively, and it may be kept to ON.

(Setting of the Terminating Resistance Value)

The resistance of the terminating resistor 35b constituting the ODT circuit 35 is the ODT non-setting by default. Thus, the resistance is set before using the ODT function and the resistance only needs to be set before the present function is used and is set, for example, during power-on.

That is, the resistance is set to the ODT circuit 35 of each NAND chip by a parameter setting sequence called, for example, Set Feature during power-on.

FIG. 6 shows an example of a table to set the resistance of the terminating resistor 35b. The table shows the relationship between the contents of a specific address and the resistance and is stored in each of a plurality of NAND chips illustrated, for example, in FIG. 2. The stored table is read during power-on and is held in, for example, a predetermined circuit in a peripheral circuit. The table can also be configured by hardware such as a logic circuit in a peripheral circuit region.

FIG. 7A schematically shows the operation of Set Feature. Set Feature is configured by a command (third instruction signal) EFh, the address Add, and data W_B0 to W_B3. The address of the table illustrated in FIG. 6 is specified by the address Add. The resistance is specified by one piece of data WB_0 to WB_3. If, for example, data 33h is set to data WB_1, a resistance R3 is selected from the table illustrated in FIG. 6. The resistance R3 is set to the ODT circuit 35 of each NAND chip.

In the case of the above operation, the same resistance can be set to the ODT circuit 35 of each NAND chip. By setting, for example, a chip address after the command, by contrast, the resistance can be set to the ODT circuit 35 for each NAND chip.

FIG. 7B schematically shows the operation of Get Feature that acquires information of parameters set to a NAND chip. Like Set Feature, Get Feature is configured by a command EEh, the address Add, and data R_B0 to R_B3. If, for example, the address of the table illustrated in FIG. 6 is specified by the address Add, data set by Set feature is read by being set to, for example, data R_B1. Accordingly, parameters set to the NAND chip can be verified.

In addition, parameters set to each NAND chip can be verified by, for example, setting the chip address after the command.

The command is not limited to commands EEh and EFh and it is only necessary to be able to individually set the ODT setting value to each NAND chip by the address.

The timing to set the resistance of the terminating resistor 35b is not limited to after power-on. Changes to the setting of the optimum resistance depending on various parameters can be made such as changing to the setting of an appropriate resistance depending on the temperature at that time by using, for example, a temperature.

According to the above embodiment, the ODT circuit 35 of a non-selected NAND chip can be set to Enable based on command XXh or YYh to set the ODT circuit 35 to Enable, an address, and a chip enable signal supplied to each non-selected NAND chip. Thus, the ODT circuits 35 of a plurality of non-selected NAND chips can be set to Enable without adding a dedicated pin to supply a control signal to the ODT circuit 35 to a package. Therefore, the size of the package can be prevented from growing and also signal characteristics can be improved by inhibiting signal reflection on the data bus.

After input/output processing of data is completed, the ODT circuits 35 can be reset, collectively by the reset command ZZh. Thus, the ODT circuits 35 can collectively be brought back to a disabled state and so wasteful consumption current can be reduced. In this case, also it is not necessary to turn off the ODT circuit 35 of a non-selected NAND chip collectively, and it may be kept to ON.

In recent years, when a plurality of packages is implemented in a NAND flash memory, an ENi/ENo pin may be added to each package. The ENi/ENo pin is connected in series between the packages and the wire of a chip enable signal provided in each package is connected in common so that the ODT circuit can be set using a chip address. In this case, however, the ENi/ENo pin needs to be newly provided in each package, which increases the chip area. In addition, a side effect of denser signal traces on a printed circuit board occurs.

Further, it is necessary to connect the wire of the chip enable signal of each NAND chip in common, which makes it difficult to individually control each NAND chip by the chip enable signal. Therefore, it is difficult to reduce a standby current by disabling a NAND chip that does not need to be operated using, for example, the chip enable signal.

According to the above embodiment, however, signal characteristics can be improved while inhibiting an increase in chip area and further, the standby current can be reduced.

Incidentally, control may be exercised so that if commands XXh and YYh are valid, the ODT circuit 35 is enabled when the chip enable signal of a non-selected NAND chip is activated and the ODT circuit 35 is disabled when the chip enable signal is inactivated. By adopting such control, the consumption current can further be reduced. Also in this case, the valid state of commands XXh and YYh is reset by command ZZh.

Also in the above embodiment, ODT is set by using a command and an address. However, the setting is not limited to the use of a command and ODT may be set by using, for example, a control signal combining the write enable signal /WE, read enable signal /RE, command latch enable signal CLE and the like or another instruction signal.

Further, the above embodiment has been described by taking a NAND flash memory as a nonvolatile semiconductor storage device as an example. However, the nonvolatile semiconductor storage device is not limited to the NAND flash memory and the present embodiment may be applied to such nonvolatile semiconductor storage devices as an MRAM, a ReRAM, and a three-dimensional memory. Further, the above embodiment is not limited to the nonvolatile semiconductor storage device and may be applied also to a volatile semiconductor storage device or other semiconductor devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a controller circuit capable of outputting a first chip enable signal, a second chip enable signal, a command latch enable signal, and an address latch enable signal;
a first semiconductor chip including a first memory cell array and a first termination circuit, and configured to receive the first chip enable signal, the first termination circuit including a first termination resistor;
a second semiconductor chip including a second memory cell array, and configured to receive the first chip enable signal; and
a third semiconductor chip including a third memory cell array, and configured to receive the second chip enable signal;
wherein the first semiconductor chip and a selected one of the second and third semiconductor chips are electrically connected to the controller circuit via a common data bus,
the controller circuit sends a first command signal and a first address signal to the first semiconductor chip, the first address signal specifying the first semiconductor chip as a first target semiconductor chip, and the first command signal representing a command for activating an on-die termination of the first target semiconductor chip without information other than the command,
the first semiconductor chip receives the first command signal while the command latch enable signal is active,
the first semiconductor chip receives the first address signal while the address latch enable signal is active,
the first semiconductor chip activates the first termination circuit based on the first command signal and the first address signal, and
the controller circuit performs data transfer with the selected one of the second and third semiconductor chips via the common data bus while the first termination circuit is active.

2. The memory system of claim 1, wherein the second semiconductor chips is electrically connected to the controller circuit via the common data bus.

3. The memory system of claim 2, wherein the first and second semiconductor chips are incorporated in different packages.

4. The memory system of claim 2, wherein the first and third semiconductor chips are incorporated in the same package.

5. The memory system of claim 1, wherein the first address signal follows the first command signal.

6. The storage device of claim 2, wherein:
the third semiconductor chip includes a second termination circuit, and the second termination circuit includes a second termination resistor;
the third semiconductor chip is electrically connected to the controller circuit via the common data bus; and wherein
the controller circuit sends a second command signal and a second address signal to the third semiconductor chip, the second address signal specifying the second semiconductor chip as a second target semiconductor chip, and the second command signal representing a command that is the same command of the first command signal for activating an on-die termination of the second target semiconductor chip,
the third semiconductor chip activates the second termination circuit based on the second command signal and the second address signal, and
the controller circuit performs data transfer with the second semiconductor chip via the common data bus while the second termination circuit is active.

7. The memory system of claim 1, wherein the first semiconductor chip inactivates the first termination circuit that is in an active state based on a third command signal.

8. The memory system of claim 1, wherein the first semiconductor chip sets a resistance of the first termination resistor based on a fourth command signal.

9. The device according to claim 1, wherein the first, second, and third semiconductor chips are one of a nonvolatile memory and a volatile memory.

10. The memory system of claim 1, wherein the first, second, and third semiconductor chips are a nonvolatile memory.

11. The memory system of claim 10, wherein the nonvolatile memory is a NAND flash memory.

12. A memory system comprising:
a controller circuit capable of outputting a chip enable signal, a command latch enable signal, and an address latch enable signal;
a first semiconductor chip including a first memory cell array and a first termination circuit, and configured to receive the chip enable signal, the first termination circuit including a first termination resistor; and
a second semiconductor chip including a second memory cell array, and configured to receive the chip enable signal, wherein:
the first and second semiconductor chips are electrically connected to the controller circuit via a common data bus; and wherein
the controller circuit sends a first command signal and a first address signal to the first semiconductor chip, the first address signal specifying the first semiconductor chip as a target semiconductor chip, and the first command signal representing a command for activating an on-die termination of the target semiconductor chip without information other than the command,
the first semiconductor chip receives the first command signal while the command latch enable signal is active,
the first semiconductor chip receives the first address signal while the address latch enable signal is active,
the first semiconductor chip activates the first termination circuit based on the first command signal and the first address signal, and
the controller circuit performs data transfer with the second semiconductor chip via the common data bus while the first termination circuit is active.

13. The memory system of claim 12, wherein the first and second semiconductor chips are incorporated in different packages.

14. The memory system of claim 12, wherein the first address signal follows the first command signal.

15. The memory system of claim 12, wherein the first semiconductor chip inactivates the first termination circuit that is in an active state based on a second command signal.

16. The memory system of claim 12, wherein the first semiconductor chip sets a resistance of the first termination resistor based on a third command signal.

17. The memory system of claim 12, wherein the first and second semiconductor chips are one of a nonvolatile memory and a volatile memory.

18. The memory system of claim 12, wherein the first and second semiconductor chips are a nonvolatile memory.

19. The memory system of claim 18, wherein the nonvolatile memory is a NAND flash memory.

* * * * *